United States Patent
Dobyns

(10) Patent No.: US 6,201,527 B1
(45) Date of Patent: Mar. 13, 2001

(54) TECHNIQUE FOR DISPLAYING ENVELOPED WAVEFORM

(75) Inventor: Kenneth P. Dobyns, Beaverton, OR (US)

(73) Assignee: Textronix, Inc., Beaverton, OR (US)

( * ) Notice: Subject to any disclaimer, the term of this patent is extended or adjusted under 35 U.S.C. 154(b) by 0 days.

(21) Appl. No.: 09/106,384

(22) Filed: Jun. 25, 1998

(51) Int. Cl.$^7$ .................................................. G09G 5/36
(52) U.S. Cl. .............................................. 345/134; 345/441
(58) Field of Search ................................... 345/134, 441; 382/207; 73/465, 602; 324/76.39; 445/145

(56) References Cited

U.S. PATENT DOCUMENTS

| | | | |
|---|---|---|---|
| 4,536,760 | * | 8/1985 | Navarro et al. ...................... 340/722 |
| 5,283,596 | * | 2/1994 | Long ................................... 345/134 |
| 5,440,676 | * | 8/1995 | Alappat et al. ...................... 395/143 |
| 6,023,530 | * | 2/2000 | Wilson ................................ 382/219 |

* cited by examiner

*Primary Examiner*—Jeffery Brier
*Assistant Examiner*—G. F. Cunningham
(74) *Attorney, Agent, or Firm*—David N. Caracappa; Thomas F. Lenihan

(57) ABSTRACT

A system for producing a signal representing an envelope waveform corresponding to the minimum and maximum excursions of an underlying signal includes a source of the underlying signal and a signal acquisition circuit coupled to the underlying signal source. A circuit for calculating the envelope of the underlying signal is coupled to the signal acquisition circuit to produce an envelope signal. A rasterizer, coupled to the signal acquisition circuit and to the envelope calculating circuit, generates the envelope waveform representative signal being a single raster displaying waveforms representing the envelope signal and the underlying signal.

14 Claims, 3 Drawing Sheets

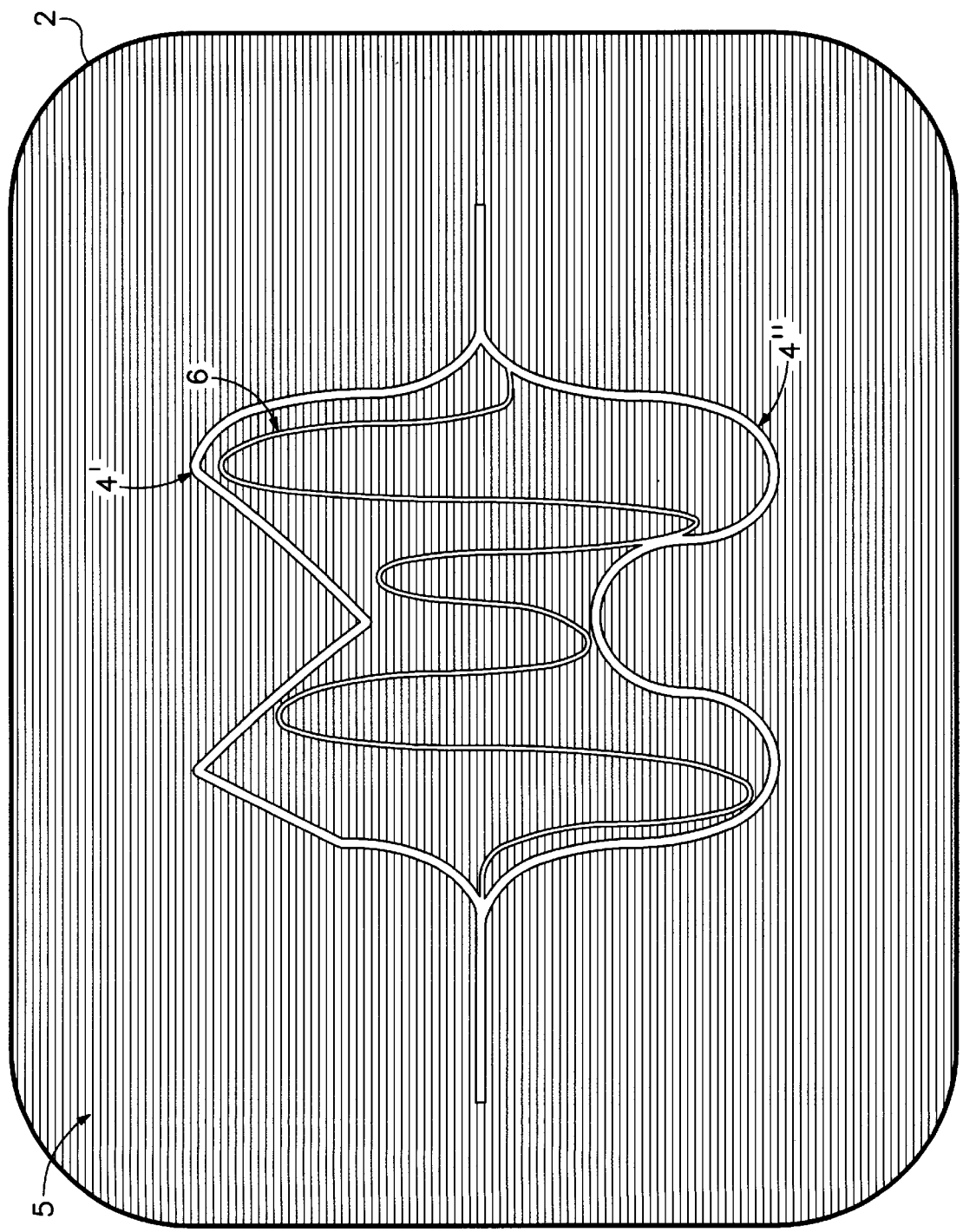

TECHNIQUE FOR DISPLAYING ENVELOPED WAVEFORM

FIELD OF THE INVENTION

The present invention relates to digital storage oscillocopes, and to a method and apparatus for displaying the envelope of a signal being displayed on such an oscilloscope.

BACKGROUND OF THE INVENTION

Digital storage oscilloscopes are well known and have many capabilities for displaying waveforms of interest to a user and information related to those waveforms. For example, the envelope of a waveform is sometimes of interest to a user. Oscilloscopes exist which have an operating mode, termed 'envelope mode', in which the minimum and maximum excursions of a signal (termed the envelope of the signal) over a predetermined number of preceding signal acquisition periods is displayed. At each acquisition, the acquired signal is analyzed to determine the new envelope waveform, and that waveform is displayed on the screen. During display of the envelope waveform, the oscilloscope is unable to display the waveform of the underlying signal. In such an oscilloscope, the envelope waveform is occasionally reset, and the signal being monitored is briefly displayed to provide the user an idea of the underlying signal. Such oscilloscopes display the envelope waveform as a fully filled-in waveform. Such a display, however, provides no information concerning the underlying signal.

For example, FIG. 1 is a display screen 2 of a prior art oscilloscope screen displaying the envelope waveform 4 of an underlying signal (not shown). In FIG. 1, the background 5 of the display screen is dark, and the displayed signal 4 is represented by a white display, in the known manner. The signal being monitored has the envelope 4 illustrated in white on in FIG. 1. As can be seen, the fully filled-in displayed waveform 4 gives no indication of the underlying signal, but only displays the minimum and maximum excursions of that signal over the period of time over which the underlying signal is enveloped.

Oscilloscopes also have the ability to rasterize an acquired waveform using sparsely populated vectors with pixels displayed at a reduced display intensity. For example, see U.S. patent application Ser. No. 09/026 185, filed <<filing date>> by Sullivan et al., incorporated by reference herein. By rasterizing using sparse vectors, and with reduced intensity, the rasterizer can process more acquisitions, giving a more accurate representation of the signal being observed.

Though the envelope mode is useful, a user may wish simultaneously to view the underlying signal and its envelope. An oscilloscope which can display the envelope waveform, while simultaneously displaying sufficient acquisitions of the underlying signal to provide an accurate indication of that signal is, thus, desirable.

SUMMARY OF THE INVENTION

In accordance with principles of the present invention, a system for producing a signal representing an envelope waveform corresponding to the minimum and maximum excursions of an underlying signal includes a source of the underlying signal and a signal acquisition circuit coupled to the underlying signal source. A circuit for calculating the envelope of the underlying signal is coupled to the signal acquisition circuit to produce an envelope signal. A rasterizer, coupled to the signal acquisition circuit and to the envelope calculating circuit, generates the envelope waveform representative signal being a single raster displaying waveforms representing the envelope and the underlying signal.

BRIEF DESCRIPTION OF THE DRAWING

In the drawing:

FIG. 3 is a display screen of an oscilloscope according to the present invention displaying the envelope waveform of an underlying signal and the underlying signal.

DETAILED DESCRIPTION

Figure 2:
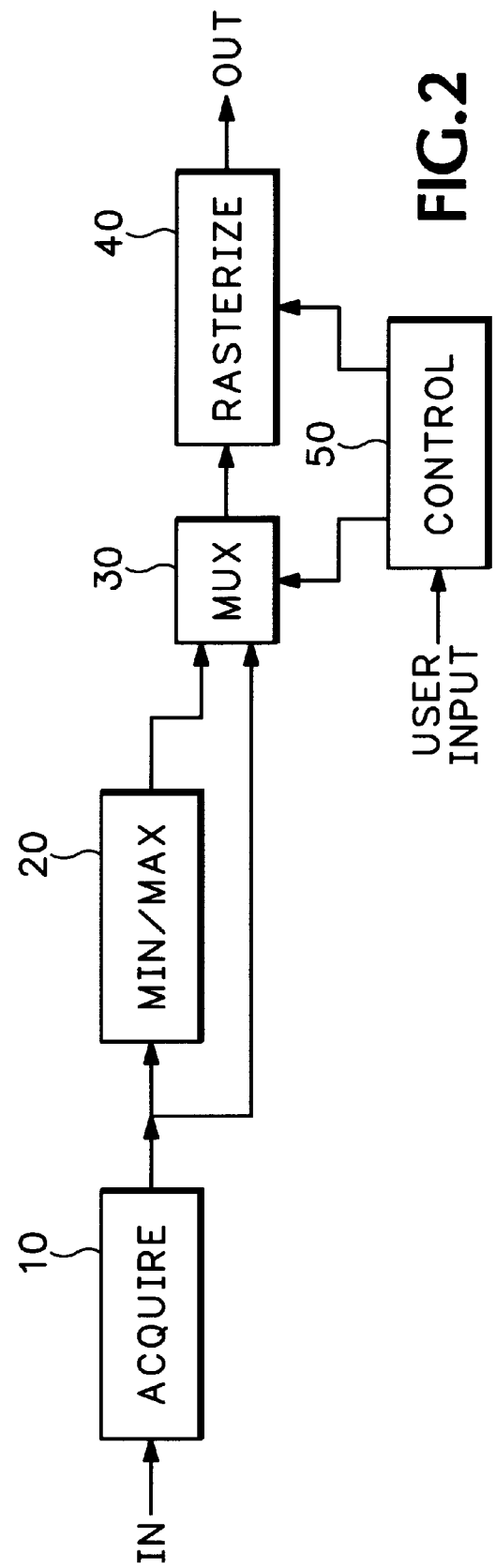
FIG. 2 is a block diagram of a portion of the circuitry in an oscilloscope for displaying an envelope waveform according to the present invention.

FIG. 2 is a block diagram of a portion of the circuitry in an oscilloscope for displaying an envelope waveform according to the present invention. There are other elements in an oscilloscope than those illustrated in FIG. 2 which have not been illustrated to simplify FIG. 2. One skilled in the art will understand what other elements are necessary, and how those elements are interconnected with those illustrated in FIG. 2.

Figure 1:
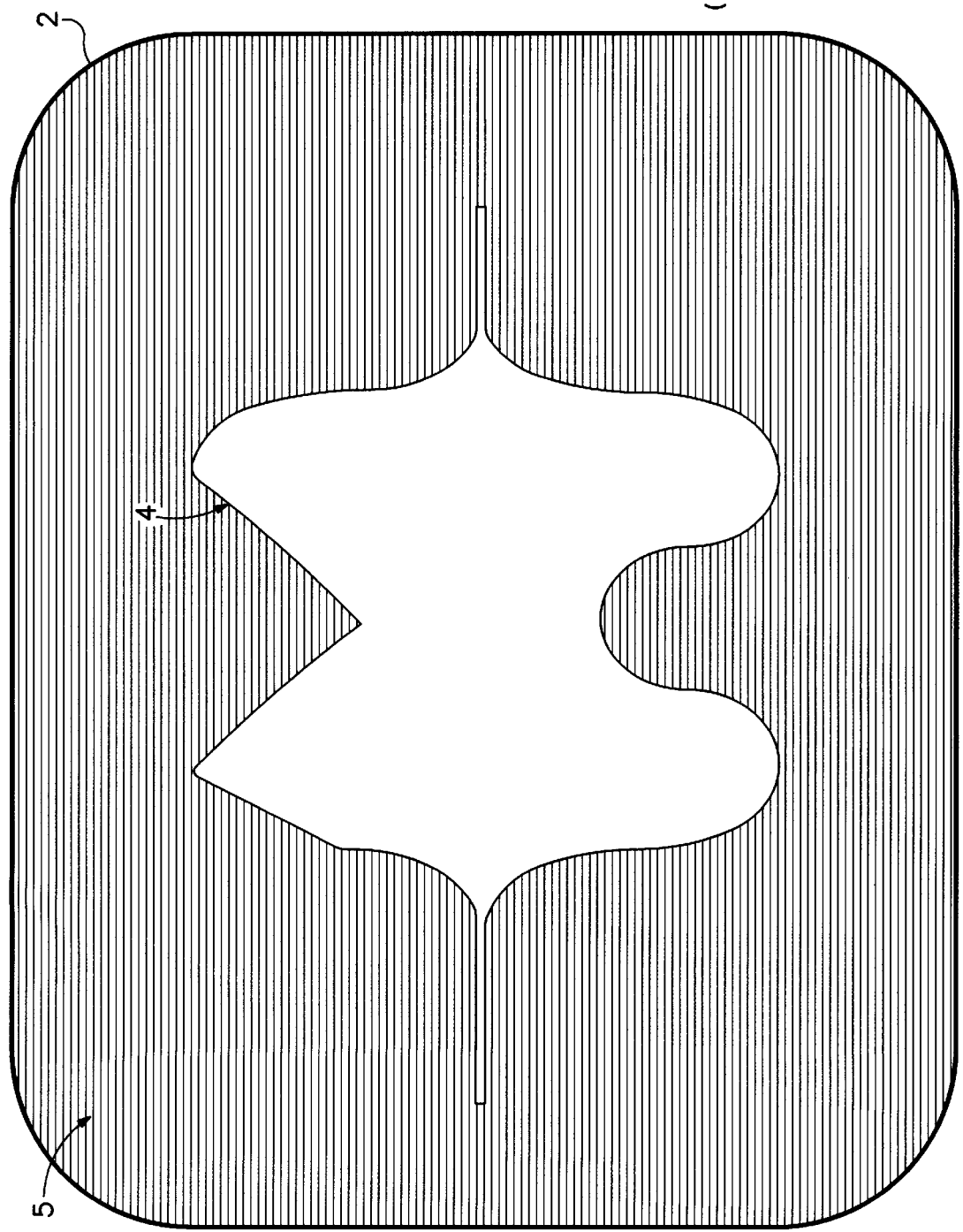
FIG. 1 is a display screen of a prior art oscilloscope displaying the envelope waveform of an underlying signal.

In FIG. 2, a data signal input terminal IN is coupled to a source (not shown) of a signal to be monitored. For example, the input terminal IN may be coupled to an oscilloscope probe. The probe is coupled to a node in a circuit generating a signal of interest. The input terminal IN is coupled to an input terminal of an acquisition circuit 10. An output terminal of the acquisition circuit 10 is coupled to an input terminal of an envelope calculating circuit 20, and to a first data input terminal of a multiplexer 30. An output terminal of the envelope calculating circuit 20 is coupled to a second data input terminal of the multiplexer 30. An output terminal of the multiplexer 30 is coupled to an input terminal of a rasterizer 40. An output terminal of the rasterizer is coupled to an output terminal OUT. The output terminal OUT generates an envelope waveform representative signal is coupled to a display device (not shown) which includes a display screen 2, as illustrated in FIG. 1.

A user control input terminal USER INPUT is coupled to a source (not shown) of a user control panel. This control panel may include knobs, switches, or any other means for receiving control input from the user of the oscilloscope, all in a known manner. The user control input terminal USER INPUT is coupled to an input terminal of a control circuit 50. Respective output terminals of the control circuit 50 are coupled to control input terminals of the multiplexer 30 and the rasterizer 40.

In operation, the acquisition circuit 10 operates in a known manner to sample, and store successive samples representing the signal being monitored at the input terminal IN. The acquisition circuit (which may include circuitry in the oscilloscope probe itself) includes circuitry which is designed to accurately reproduce in the acquisition circuit 10 the signal at the oscilloscope probe. This signal is then provided to a sampler, which generates a sequence of multibit digital samples representing that signal. The values of the samples represent the e.g. voltage of the signal being monitored. The location of the sample in the sequence of samples represents the temporal location of the sample in the signal being monitored. This sequence of multibit digital samples are stored in sequentially related storage locations in an acquisition memory. These samples are then retrieved from the acquisition memory and processed by other circuitry in the oscilloscope to produce a waveform display representing those samples, all in a manner described in more detail below.

In FIG. 2, the acquired signal samples are supplied to the envelope calculating circuit 20. This circuit retrieves the sequence of signal samples from the acquisition memory in the acquisition circuit 10, and maintains, on a sample-by-sample basis, minimum and maximum values for each sample in the sequence. In the illustrated embodiment, these minimum and maximum values are stored as a sequence of sample pairs, in an envelope memory. In order to minimize the amount of memory necessary, and because each pair represents two waveform points, only half as many samples are stored in the envelope memory as in the acquisition memory. Thus, there are two memories containing sequences of samples: the acquisition memory containing sequential samples representing the signal being monitored; and the envelope memory containing sequential sample pairs, each pair representing the minimum value and maximum value of a corresponding sample of the acquired signal.

The rasterizer 40 receives a sequence of samples, and produces a set of pixels in a raster representing those samples. As is known, the raster consists of an array of horizontal rows and vertical columns, each element representing a picture element (pixel) of the raster. Each one of the samples in the sequence of samples is represented by a pixel in the raster. Each pixel is represented by a multibit digital sample representing the intensity of illumination of that pixel. For example, one value of the pixel sample represents black, or no illumination, while the remaining values of the pixel sample represent varying shades of gray from dark gray to white. Typically, the e.g. voltage represented by the value of a sample determines the vertical location of a pixel representing that sample, and the time derived from the location of the sample in the sequence of samples determines the horizontal location of the pixel representing the sample. The pixel in the raster representing the sample is illuminated to some non-black intensity level, while all the others remain unchanged, e.g. at the black level.

The rasterizer 40 stores the raster data, consisting of data representing the intensity of each pixel in the raster, in respective predetermined memory locations of a raster memory (not shown) in the rasterizer 40. Utilization circuitry (not shown) then retrieves the raster data from the raster memory, and generates signals representing that raster for generating the display on the display screen 2 (of FIG. 1).

The multiplexer 30 is controlled in response to a control signal from the control circuit 50. The control signal first conditions the multiplexer 30 to couple the retrieved sequence of samples from the acquisition memory in the acquisition circuit 10 to the rasterizer 40. The rasterizer 40 incorporates pixel data representing that sequence of samples into the raster memory in a manner to be described in more detail below. the multiplexer is controlled to couple the sequence of samples representing the envelope of the acquired signal from the envelope calculating circuit 20 to the rasterizer 40. This sample sequence is supplied to the rasterizer in time order. That is, the rasterizer receives the minimum and maximum values for the first time point, then the minimum and maximum values for the next time point, etc. When the rasterizer 40 rasterizes this sample sequence, the result is an envelope waveform. The rasterizer 40 incorporates pixel data representing that sequence of samples into the raster memory, also in a manner to be described in more detail below.

In general, the rasterizer 40 can rasterize a sequence of samples in one of several ways. In a 'dot mode' the pixels in the raster are generated by the rasterizer 40 in the manner described above in which each sample is represented by one pixel, and each pixel represents one sample. The intensity level of the dots in the raster is set under control of the control circuit 50, which may, in turn, respond to a used input to set this intensity level.

Sometimes, however, there is a distance on the display screen 2 between dots representing samples being rasterized. This can make the waveform represented by the sample sequence hard for the user to see or evaluate. For this reason, the rasterizer 40 can operate in a 'vector' mode. In this mode, the rasterizer 40 'fills-in' the space between the sample representative dots with a vector, or line connecting those dots, in any one of a number of known ways. This creates a more continuous waveform display with dots representing the sequence of samples, and interstitial vectors drawn between them. This continuous waveform is easier for the user to see and evaluate. As in the 'dot' mode, in the 'vector' mode, the intensity of the pixels making up the dots and vectors are controlled by the control circuit 50, which, in turn, may respond to a user input to set this intensity.

It takes time, however, for the rasterizer 40 to generate each pixel of the vectors between the sample representative dots. Thus, rasterizers are known which do not generate continuous vectors, as described above, but instead generate what are termed 'sparse vectors'. Sparse vectors are not continuous interstitial lines between sample representative dots, but instead are dotted lines which, themselves, contain gaps between their dots. This represents an intermediate display between that of the 'dot' mode and that of the 'vector' mode. As in the 'dot' and 'vector' modes, the intensity of the pixels making up the sparse vectors are controlled by the control circuit 50, which, in turn, may respond to a user input to set this intensity.

Because sparse vectors contain only a fraction of the number of pixels contained in regular continuous vectors, and because it takes time to generate each pixel in the raster, when the rasterizer 40 operates in the 'sparse vector' mode it can rasterize a sample sequence in less time than in regular 'vector' mode. Because a new acquisition cannot occur until the last one is rasterized, the 'sparse vector' mode allows the oscilloscope to acquire and process more signals than when operating in the regular 'vector' mode. In particular, Al tie 'envelope' mode according to the present invention, two sample sequences, the acquired signal, the envelope sample sequences, are being rasterized, so it is important to rasterize them in as short a time period as possible.

Rasterizers are further known which implement automatic attack and decay characteristics which mimic the display characteristics of older analog oscilloscopes. For example, after a pixel has been 'hit', meaning it has been illuminated because it represents a portion of a waveform display, the rasterizer can automatically begin to slowly decrease (decay) the intensity of that pixel, rather than immediately turning it off. This mimics the persistence characteristics of the phosphors used on analog oscilloscope display screens. Further, the rasterizer can increase the intensity of a pixel which is still visible should it be 'hit' again. This, again, mimics the characteristics of the phosphors of the analog oscilloscopes. The result is that pixels which are 'hit' continuously will be brighter than those which are 'hit' intermittently.

Because the envelope waveform tends to change more slowly than the underlying signal, when it is rasterized by a rasterizer as just described, the pixels forming the envelope waveform tend to be 'hit' more often and, thus, are rasterized into brighter pixels than the pixels representing the underlying acquired input signal. FIG. 3 is a display screen of an oscilloscope according to the present invention, and including such a rasterizer, displaying the envelope waveform of an underlying signal and the underlying signal itself. In FIG. 3, both the waveform representing the envelope of the acquired signal, including the maximum waveform 4' and the minimum waveform 4", and the waveform representing the acquired signal 6 are displayed on the display screen 2. The envelope waveform (4',4") is displayed at a higher intensity than the acquired signal waveform 6, while the remainder 5 of the display screen 2 remains dark. The control circuit 50 can simultaneously control the intensity of all the displayed waveforms, possibly in response to a user input. The intensities may also be controlled separately to change the relative intensities of the envelope and acquired waveforms.

One skilled in the art, however, will understand that the present invention may be implemented with a single-bit monochrome rasterizer which has only a two intensities: 'on' and 'off', and does not require the attack and decay characteristics just described. In such a case, an underlying signal formed with vectors may appear brighter than the envelope signal formed with dots, or both waveforms may appear at equal intensities.

From FIG. 3 it can be seen that by allowing the user to simultaneously see both the envelope waveform and the underlying waveform, the characteristics of the signal generating the displayed envelope can be seen, and analyzed by the user.

What is claimed is:

1. A system for displaying waveforms representing respective signals, comprising:
    a signal acquisition circuit, coupled to an input signal source, for acquiring samples of an input signal;
    a circuit, coupled to the signal acquisition circuit, for selecting a subset of samples representing points of minimum and maximum excursion of said input signal and calculating the envelope of the acquired signal;
    a first memory for storing for display waveform data relating to said samples of said input signal;
    a second memory for storing for display data resulting from said calculation of said envelope; and
    a rasterizer, selectable coupled to said first memory and to said second memory, for generating an envelope and waveform representative signal within a single raster for simultaneously displaying waveforms representing the envelope and the acquired signal, said waveform representing said acquired signal having a greater number of samples than the number of minimum and maximum points of said envelope.

2. The system of claim 1, wherein the signal acquisition circuit comprises:
    a sampler, for generating a sequence of samples representing the input signal; and
    said first memory is an acquisition memory for storing the input signal representative sequence of samples.

3. The system of claim 2 wherein the calculating circuit comprises:
    circuitry for retrieving the sample sequence from the acquisition memory; and
    circuitry for processing each sample in the sequence, on a sample-by-sample basis, comprising:
        circuitry for maintaining a maximum value for each sample;
        circuitry for maintaining a minimum value for each sample; and
    said second memory is an envelope memory, for storing a sequence of sample pairs representing the respective maximum and minimum values.

4. The system of claim 3 wherein the rasterizer comprises:
    a raster memory storing data representing an array of pixels representing a waveform display; and
    raster forming circuitry for receiving a sequence of samples, generating waveform data representing the received sequence of samples, and storing the waveform data in the raster memory.

5. The system of claim 4 wherein the raster forming circuitry further comprising circuitry for retrieving pixel data from the raster memory and generating an output signal representing the waveform display.

6. The system of claim 4 wherein the raster forming circuitry comprises circuitry for generating pixel data representing each of the received samples in the sequence of samples, and storing the pixel representative data in the raster memory.

7. The system of claim 6 wherein the pixel data generating circuitry generates one pixel for each sample in the sequence of samples.

8. The system of claim 6 wherein the pixel data generating circuitry generates one pixel representing each sample in the sequence of samples, and respective vectors of pixels between each sample representative pixel.

9. The system of claim 6 wherein the pixel data generating circuitry generates one pixel representing each sample in the sequence of samples, and respective sparse vectors of pixels between each sample representative pixel.

10. The system of claim 4 wherein the raster forming circuitry comprises:
    circuitry for retrieving the sample sequence from the acquisition memory, generating waveform data representing that sample sequence, and storing that data in the raster memory; and
    circuitry for retrieving the sample pair sequence from the envelope memory, generating waveform data representing that sample pair sequence, and storing that data in the raster memory.

11. The system of claim 10 further comprising:
    a multiplexer having a first data input terminal coupled to the calculating circuitry, a second data input terminal coupled to the acquisition circuitry, and an output terminal coupled to the rasterizer; and
    control circuitry coupled to the multiplexer and the rasterizer; wherein:
        when the control circuitry controls the multiplexer to couple the acquisition circuit to the rasterizer, the control circuit controls the rasterizer to generate pixel data representing the acquired signal; and
        when the control circuit controls the multiplexer to couple the calculating circuitry to the rasterizer, the control circuit controls the rasterizer to generate pixel data representing the envelope waveform.

12. A method for operating a system for displaying waveforms representing respective signals, comprising the steps of:
    acquiring samples of an input signal;
    storing for display data related to said signal samples in a first memory;
    selecting from said samples a subset of samples representing points of minimum and maximum excursion of said input signal;
    calculating from said subset of samples data representing an envelope of the acquired signal;
    storing for display data resulting from said calculation of said envelope in a second memory;

rasterizing said signal sample data and said envelope data; and displaying simultaneously respective waveforms representing the acquired signal, and the envelope of the acquired signal, said waveform representing said acquired signal having a greater number of samples than the number of minimum and maximum points in said envelope.

13. The method of claim 12, wherein the step of acquiring the input signal comprises the steps of generating a sequence of samples representing the input signal.

14. The method of claim 13, wherein:

the calculating step comprises the step of calculating a sequence of sample pairs respectively representing the maximum excursion of the acquired signal and the minimum excursion of the acquired signal; and the displaying step comprises the step of displaying respective waveforms representing the maximum and minimum excursion of the acquired signal, and the acquired signal.

* * * * *